United States Patent [19]

Ulmer

[11] 4,383,223
[45] May 10, 1983

[54] CMOS OPERATIONAL AMPLIFIER EMPLOYING PUSH-PULL OUTPUT STAGE

[75] Inventor: Richard W. Ulmer, Austin, Tex.

[73] Assignee: Motorola, Inc., Schammburg, Ill.

[21] Appl. No.: 138,968

[22] Filed: Apr. 10, 1980

[51] Int. Cl.³ .......................... H03F 3/45; H03F 3/26
[52] U.S. Cl. .................................... 330/253; 330/257; 330/269
[58] Field of Search ............... 330/253, 255, 257, 264, 330/269

[56] References Cited

U.S. PATENT DOCUMENTS 4,213,098 7/1980 Tsividis ............................... 330/253
4,267,519 5/1981 Schade, Jr. ......................... 330/253
4,284,959 8/1981 Heagerty et al. ................... 330/253

Primary Examiner—James B. Mullins
Assistant Examiner—Gene Wan
Attorney, Agent, or Firm—Anthony J. Sarli; Vincent B. Ingrass; Robert Lee King

[57] ABSTRACT

A CMOS operational amplifier includes a biasing scheme for supplying current to a differential stage. A push-pull output stage includes a current sinking transistor which is coupled to a first output of the differential stage. A current mirror is coupled between a second output of the differential stage and the gate electrode of a current sourcing device in the output stage.

8 Claims, 2 Drawing Figures

CMOS OPERATIONAL AMPLIFIER EMPLOYING PUSH-PULL OUTPUT STAGE

BACKGROUND OF THE INVENTION

1. Field of the Invention

This invention relates generally to operational amplifiers, and more particularly, to an improved CMOS operational amplifier utilizing a push-pull output stage.

2. Description of the Prior Art

Operational amplifiers comprised entirely of MOS field effect transistors (MOSFETs) are well known. Such amplifiers exhibit large input impedance which is characteristic of the gate-to-source impedance of MOSFETs in general. Since the MOSFET is a voltage driven device as contrasted to bipolar transistors which are current driven devices, extremely low offset and bias currents can be realized using MOSFETs for input transistors. A MOSFET operational amplifier exhibits leakage current lying in the range of picoamperes rather than in the range of nanoamperes as found in bipolar amplifiers.

A CMOS operational amplifier can be made to operate with an extremely large input common mode voltage swing. When such an amplifier operates from a single positive supply voltage, it can operate with negative input common mode voltage signals.

A further advantage of CMOS operational amplifiers is that true complimentary symmetry can be obtained since p-channel and n-channel devices can be made using the same process. Additionally, satisfactory gains are obtainable using CMOS amplifiers due to the low capacitance of the MOSFETs.

One known CMOS operational amplifier comprises a differential stage, a biasing scheme for establishing a desired current into the differential stage, and an output stage which employs a passive MOSFET load. It has been determined, however, that the transient response of the amplifier may be greatly improved if the passive load output stage is replaced with a push-pull stage. Such an operational amplifier is available from Intersil and bears part number ICL 761X. This operational amplifier, however, requires a large number of components and therefore suffers from the disadvantage of high power consumption and increased silicon area.

SUMMARY OF THE INVENTION

It is an object of the present invention to provide an improved operational amplifier.

It is a further object of the present invention to provide an improved CMOS operational amplifier which utilizes a push-pull output stage.

It is a still further object of the present invention to provide an improved CMOS operational amplifier which is relatively simple, utilizes fewer components and consumes less power.

According to an aspect of the invention, there is provided a CMOS operational amplifier, comprising: a differential stage having first and second inputs and first and second outputs, said first and second inputs for receiving first and second input voltages; first means coupled to said differential stage and to a source of supply voltage for supplying a constant current to said differential stage; a push-pull output stage coupled to said supply voltage and having third and fourth inputs, said third input coupled to said first output; and current mirror means coupled between said second output and such fourth input for biasing the output stage.

The above and other objects, features and advantages of the present invention will be more clearly understood from the following detailed description taken in conjunction with the accompanying drawings in which:

DESCRIPTION OF THE PREFERRED EMBODIMENT

Figure 1:
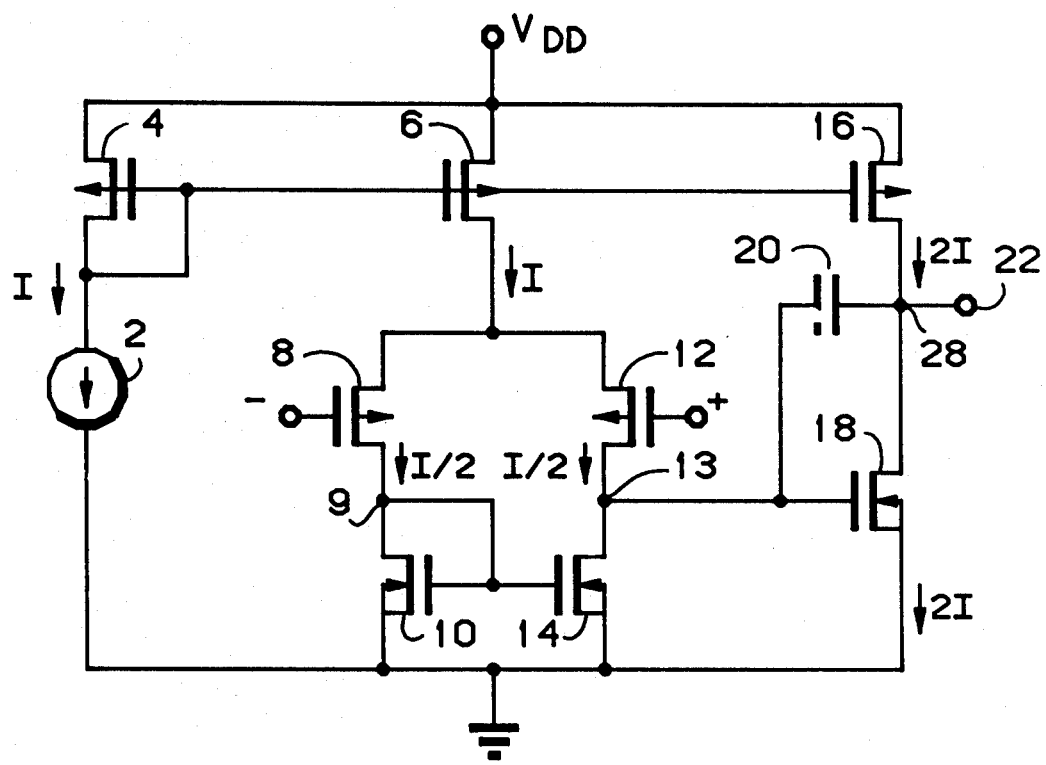
FIG. 1 is a schematic diagram of a CMOS operational amplifier in accordance with the prior art.

FIG. 1 is a schematic diagram of a CMOS operational amplifier in accordance with the prior art. It comprises a biasing stage, a current source, a differential stage and an output stage.

The biasing stage includes a current source 2 which sets up a current I through p-channel field-effect transistor 4. It should be noted that in the description which follows, certain ones of the field-effect transistors are referred to as p-channel and others are referred to as n-channel. It would be obvious, however, to one skilled in the art that certain p-channel and n-channel devices may be substituted for each other and still yield an operative arrangement.

Transistor 4 is diode connected. Its source electrode is coupled to a source of supply voltage VDD, and its gate and drain electrodes are coupled to both current source 2 and to the gate of p-channel field-effect transistor 6 which has a source electrode coupled to VDD and a drain electrode coupled to the differential stage.

The differential stage includes p-channel field-effect transistors 8 and 12 and n-channel field-effect transistors 10 and 14. As can be seen, the source electrodes of transistors 8 and 12 are coupled together and to the drain electrode of transistor 6. The gate electrode of transistor 8 is coupled to a first voltage (−), and the gate electrode of transistor 12 is coupled to a second voltage (+). The drain electrodes of transistors 8 and 12 are coupled respectively to nodes 9 and 13. Transistors 10 and 14 each have source electrodes coupled to ground and drain electrodes coupled to nodes 9 and 13 respectively. The gate electrodes of transistors 10 and 14 are coupled together and to the drain electrode of transistor 10.

The output stage comprises p-channel field-effect transistor 16, n-channel field-effect transistor 18 and frequency compensation capacitor 20. Transistor 16 has a gate electrode coupled to the gate electrode of transistor 6, a source electrode coupled to VDD and a drain electrode coupled to node 28. Transistor 18 has a drain electrode coupled to node 28, a source electrode coupled to ground and a gate electrode coupled to node 13. Capacitor 20 is coupled between the gate electrode of transistor 18 and node 28. The circuit output which appears at terminal 22 is taken from node 28.

Current source 2 establishes a current (I) through transistor 4 which is mirrored to transistor 6; i.e., since transistor 4 is diode connected, a voltage will be set up at its gate which permits a current I to flow through its source and drain. This gate voltage is also applied to the gate of transistor 6 so as to permit the same current (I) to flow. In a balanced condition, current I will be split such that a current I/2 flows in each leg of the differential stage.

Output transistor 18 has a width-to-length ratio (W/L) so as to produce some multiple of a current flowing through the drain of transistor 14. For example, if the width-to-length ratio of transistor 18 is four times that of transistor 14, then a current of 2I will flow through transistor 18. If the output voltage at terminal 22 is to reside at half the supply voltage in a balanced state, then transistor 16 must source a current equivalent to 2I. This may be accomplished by, for example, doubling the width-to-length ratio of transistor 16 with respect to that of transistor 6. With the gate of transistor 16 coupled to the gate of transistor 6, transistor 16 acts as a fixed current source.

The circuit operates as follows. If the voltage at the gate of transistor 12 decreases, current flowing into node 13 will increase. An increase in current through transistor 12 will be accompanied by a decrease in current through transistor 8. A reduced voltage at node 9 will result in devices 10 and 14 becoming less conductive. Thus, the voltage at node 13 will increase turning transistor 18 on harder. With transistor 18 sinking more current than is being sourced by transistor 16, the output voltage at terminal 22 will go low. If, on the other hand, the voltage at the (−) terminal were to decrease with respect to that at the (+) terminal, the current flow through transistor 8 would increase resulting in a corresponding decrease of current flow through transistor 12. The increased current flow through transistor 8 will cause the voltage at node 9 to increase thus tuning devices 10 and 14 on harder. When device 14 turns on harder, it conducts more current resulting in a decrease in voltage at node 13 and consequently at the gate of output transistor 18. Transistor 18 will then begin to sink less current causing the voltage at node 28 and therefore the output voltage at terminal 22 to increase. When the output approaches some terminal value, the gate of transistor 18 must be brought back up from ground in order to begin sinking current being sourced by transistor 16. However, since the voltage at the gate electrode of transistor 18 was virtually at ground, it has a long way to rise before transistor 18 will sink enough current to stabilize the voltage at node 22. In view of this, some overshoot may occur.

Figure 2:
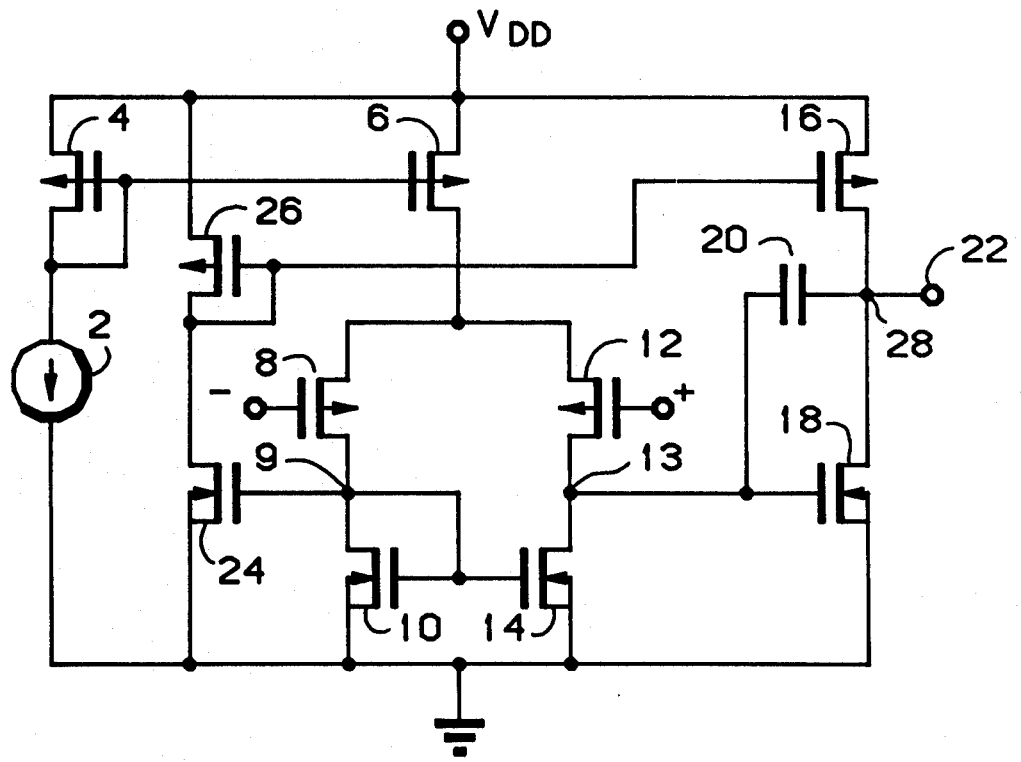
FIG. 2 is a schematic diagram of a CMOS operational amplifier according to the present invention.

FIG. 2 is a schematic diagram of a CMOS operational amplifier including a push-pull output stage in accordance with the present invention. As can be seen, like elements have been denoted with like reference numerals. The circuit in FIG. 2 has been modified with respect to that shown in FIG. 1 by adding p-type field-effect transistor 26 and n-type field-effect transistor 24. Furthermore, the gate of transistor 16 instead of being coupled to the gate of transistor 6, is now coupled to the gate of transistor 26 to form a mirror therewith. New transistor 24 has a gate electrode coupled to node 9, a source electrode coupled to ground and a drain electrode coupled to the drain of transistor 26. The source electrode of transistor 26 is coupled to VDD, and its gate electrode is coupled to its drain electrode. In the balanced condition (i.e. I/2 flowing through transistor 8), I/2 is mirrored to transistor 24 if the width-to-length ratio of transistor 24 is substantially equal to that of transistor 10. Since a current of 2I is flowing through transistor 18 as described above, it is necessary that a current of 2I flow through transistor 16 so as to enable the output voltage at 22 to reside at half the supply voltage. This may be accomplished as follows. If the channel width-to-length ratio of transistor 16 is substantially four times that of the width-to-length ratio of transistor 26, then a current of 2I will flow through transistor 16 in the balanced condition.

Let us assume now that the voltage at the (−) terminal is substantially lower than that at the (+) terminal such that substantially all of the current flowing through transistor 6 flows through transistor 8 and none of the current flowing through transistor 6 flows through transistor 12. The voltage at node 9 would increase causing transistors 14 and 24 to turn on harder. This will cause the voltage at node 13 to be pulled to ground substantially turning off transistor 18. Current mirror 24 then causes current I to flow through transistor 26. Since the channel width-to-length ratio of transistor 16 is four times that of transistor 6, a current of 4I will flow through transistor 16.

If, on the other hand, the voltage at the (+) terminal were to decrease such that all of the current I flowing through transistor 6 flowed through transistor 12 and none of the current flowing through transistor 6 flowed through transistor 8, then the voltage at node 9 would decrease tending to turn off transistors 10, 14 and 24. This would cause the voltage at node 13 to increase turning transistor 18 on. With no voltage at the gate of transistor 24, no current will be pulled through transistor 26 and therefore transistor 16 will source no current. Thus, the voltage at node 28 and output terminal 22 will fall to a low level.

It can be seen that the inventive circuit offers the advantage of increased current available for output drive. That is, the output source current may vary from zero to 4I instead of being fixed at 2I as was the case in the FIG. 1 circuit. Furthermore, due to the push-pull action of transistors 16 and 18, as the voltage at node 28 increases to a terminal value, not only will transistor 18 begin to conduct but transistor 16 will be rendered less conductive, thus reducing overshoot at node 28. Furthermore, current consumed by the circuit shown in FIG. 2 has been substantially reduced with respect to the circuit shown in FIG. 1 when producing the same output drive current.

The above description is given by way of example only. Changes in form and details may be made by one skilled in the art without departing from the scope of the invention as defined by the appended claims.

I claim:
1. A CMOS operational amplifier, comprising:
   a differential stage having first and second inputs and first and second outputs, said first and second inputs for receiving first and second input voltages;
   a first field-effect transistor having its current conducting path coupled between said second output and ground, and the gate electrode thereof coupled to said second output;
   a second field-effect transistor having its current conducting path coupled between said first output and ground, and the gate electrode thereof coupled to the gate electrode of said first field-effect transistor;
   first means coupled to said differential stage and to a supply voltage terminal for supplying a constant current to said differential stage;
   a push-pull output stage coupled to said supply voltage terminal and having third and fourth inputs, said third input coupled to said first output; and
   third and fourth field-effect transistors, said third field-effect transistor having a first current electrode coupled to said supply voltage terminal and both a second current electrode and a gate elec- trode connected together and coupled to said fourth input, and said fourth field-effect transistor having a first current electrode coupled to the second current electrode of said third field-effect transistor, a second current electrode connected directly to ground, and a gate electrode coupled to said second output.

2. An operational amplifier according to claim 1 wherein said third field-effect transistor is a p-channel field-effect transistor and wherein said fourth field-effect transistor is an n-channel field-effect transistor.

3. An operational amplifier, comprising:
a differential stage having first and second inputs and first and second outputs, said first and second inputs for receiving first and second input voltages;
a first field-effect transistor having its current conducting path coupled between said second output and ground, and the gate electrode thereof coupled to said second output;
a second field-effect transistor having its current conducting path coupled between said first output and ground, and the gate electrode thereof coupled to the gate electrode of said first field-effect transistor;
first means coupled to said differential stage and to a supply voltage terminal for supplying a constant current to said differential stage;
third and fourth field-effect transistors having their current conducting paths coupled in series between said supply voltage terminal and ground, said third field-effect transistor being diode connected and said fourth field-effect transistor having a gate electrode coupled to said second output;
a push-pull output stage comprising fifth and sixth field-effect transistors, said fifth field-effect transistor having a first current electrode coupled to said supply voltage terminal, a gate electrode coupled to a gate electrode of said third field-effect transistor, and a second current electrode, said sixth field-effect transistor having a first current electrode coupled to the second current electrode of said fifth field-effect transistor, a gate electrode coupled to said first output, and a second current electrode coupled to ground.

4. An operational amplifier according to claim 3 wherein the current sourced by said fifth field-effect transistor is substantially equal to current conducted by said sixth field-effect transistor when said first input voltage is substantially equal to said second input voltage.

5. An operational amplifier according to claim 4 wherein said fifth field-effect transistor is a p-channel field-effect transistor and wherein said sixth field-effect transistor is an n-channel field-effect transistor.

6. An operational amplifier, comprising:
a differential stage having first and second inputs and first and second outputs, said first and second inputs for receiving first and second input voltages;
a first field-effect transistor having its current conducting path coupled between said second output and ground, and the gate electrode thereof coupled to said second output;
a second field-effect transistor having its current conducting path coupled between said first output and ground, and the gate electrode thereof coupled to the gate electrode of said first field-effect transistor;
current source means coupled to said differential stage and to a supply voltage terminal for supplying a constant current to said differential stage;
third and fourth field-effect transistors comprising a push-pull output stage having their current conducting paths coupled in series between said supply voltage terminal and ground, a gate electrode of said third field-effect transistor forming a first input of said push-pull output stage and a gate electrode of said fourth field-effect transistor forming a second input of said push-pull output stage which is coupled to the first output of said differential stage; and
fifth and sixth field-effect transistors having their current conducting paths coupled in series between said supply voltage terminal and ground, said fifth field-effect transistor being diode connected and having a gate electrode coupled to the gate electrode of said third field-effect transistor, and said sixth field-effect transistor having a gate electrode coupled to the second output of said differential stage.

7. An operational amplifier according to claim 6 wherein said differential stage comprises seventh and eight field-effect transistors which are p-channel field-effect transistors and wherein said first and second field-effect transistors are n-channel field-effect transistors.

8. An operational amplifier according to claim 6 wherein the width/length ratio of said fourth field-effect transistor is four times that of said second field-effect transistor and wherein the width/length ratio of said third field-effect transistor is four times that of said fifth field-effect transistor.

* * * * *